United States Patent
Kim et al.

(10) Patent No.: US 12,517,432 B2
(45) Date of Patent: Jan. 6, 2026

(54) SUBSTRATE TREATING COMPOSITION AND METHOD FOR FABRICATING A SEMICONDUCTOR DEVICE USING THE SAME

(71) Applicants: SAMSUNG ELECTRONICS CO., LTD., Suwon-si (KR); NISSAN CHEMICAL CORPORATION, Tokyo (JP)

(72) Inventors: Ju-Young Kim, Hwaseong-si (KR); Hyunwoo Kim, Hanam-si (KR); Makoto Nakajima, Toyama (JP); Satoshi Takeda, Toyama (JP); Shuhei Shigaki, Toyama (JP); Wataru Shibayama, Toyama (JP)

(73) Assignees: SAMSUNG ELECTRONICS CO., LTD., Suwon-si (KR); NISSAN CHEMICAL CORPORATION, Tokyo (JP)

( * ) Notice: Subject to any disclaimer, the term of this patent is extended or adjusted under 35 U.S.C. 154(b) by 999 days.

(21) Appl. No.: 17/453,249

(22) Filed: Nov. 2, 2021

(65) Prior Publication Data
US 2022/0057715 A1 Feb. 24, 2022

Related U.S. Application Data

(62) Division of application No. 16/243,548, filed on Jan. 9, 2019, now Pat. No. 11,215,927.

(30) Foreign Application Priority Data

Apr. 13, 2018 (KR) .................. 10-2018-0043246

(51) Int. Cl.
*G03F 7/11* (2006.01)
*C09D 183/08* (2006.01)
(Continued)

(52) U.S. Cl.
CPC .............. *G03F 7/11* (2013.01); *C09D 183/08* (2013.01); *G03F 7/038* (2013.01); *G03F 7/039* (2013.01);
(Continued)

(58) Field of Classification Search
CPC .................. G03F 7/11; C09D 183/04
See application file for complete search history.

(56) References Cited

U.S. PATENT DOCUMENTS 3,437,517 A * 4/1969 Eilerman ................ C03C 25/36
427/386
4,933,381 A * 6/1990 Hager ..................... C03C 25/26
523/426
(Continued)

FOREIGN PATENT DOCUMENTS

CN 101910949 12/2010
CN 102124064 7/2011
(Continued)

OTHER PUBLICATIONS

Dufaud, et al., "Design of Heterogeneous Catalysts via Multiple Active Site Positioning in Organic-Inorganic Hybrid Materials", J. Am. Chem. Soc. 2003, 125, pp. 9403-9413.

*Primary Examiner* — Martin J Angebrannt
(74) *Attorney, Agent, or Firm* — Morgan, Lewis & Bockius LLP

(57) ABSTRACT

Provided is a substrate treating composition. The substrate treating composition includes a first monomer, a second monomer and an acid. The first monomer is represented by Formula 1 and the second monomer is represented by Formula 7. The molecular weight of the solid content of the substrate treating composition including the first monomer, the second monomer and the acid is from about 1,000 g/mol to about 50,000 g/mol.

(Continued)

$$X\text{—}Si(R1)_2(R2) \qquad [\text{Formula 1}]$$

$$Y\text{—}Si(R3)_3 \qquad [\text{Formula 7}]$$

8 Claims, 4 Drawing Sheets

(51) Int. Cl.
*G03F 7/038* (2006.01)
*G03F 7/039* (2006.01)
*G03F 7/075* (2006.01)
*G03F 7/16* (2006.01)
*G03F 7/20* (2006.01)

(52) U.S. Cl.
CPC .......... *G03F 7/0757* (2013.01); *G03F 7/2004* (2013.01); *G03F 7/162* (2013.01); *G03F 7/168* (2013.01)

(56) References Cited

U.S. PATENT DOCUMENTS

| | | | |
|---|---|---|---|
| 4,950,583 A | 8/1990 | Brewer et al. | |
| 5,907,015 A * | 5/1999 | Sexsmith | C08G 77/26 524/588 |
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,835,093 B2 | 9/2014 | Shibayama et al. | |
| 8,864,894 B2 | 10/2014 | Shibayama et al. | |
| 8,968,458 B2 | 3/2015 | Konno et al. | |
| 8,999,630 B2 | 4/2015 | Hatakeyama et al. | |
| 9,005,873 B2 | 4/2015 | Sakamoto et al. | |
| 9,023,583 B2 | 5/2015 | Kishioka et al. | |
| 9,023,588 B2 | 5/2015 | Nakajima et al. | |
| 9,170,492 B2 | 10/2015 | Kawazu et al. | |
| 9,760,006 B2 | 9/2017 | Nakajima et al. | |
| 10,133,179 B2 | 11/2018 | Sung et al. | |
| 2005/0277058 A1 * | 12/2005 | Iwabuchi | G03F 7/091 430/272.1 |
| 2011/0233648 A1 | 9/2011 | Seol et al. | |
| 2012/0315765 A1 * | 12/2012 | Nakajima | C09D 183/08 524/588 |
| 2013/0216956 A1 * | 8/2013 | Kishioka | G03F 7/20 430/324 |
| 2014/0170855 A1 * | 6/2014 | Nakajima | C07F 7/1804 556/428 |
| 2016/0222262 A1 | 8/2016 | Tamura et al. | |
| 2018/0149977 A1 * | 5/2018 | Shibayama | C08G 77/26 |
| 2018/0186820 A1 | 7/2018 | Katsukawa et al. | |
| 2019/0317406 A1 | 10/2019 | Kim et al. | |
| 2021/0198496 A1 | 7/2021 | Pathak et al. | |

FOREIGN PATENT DOCUMENTS

| | | | |
|---|---|---|---|
| CN | 102754034 | 10/2012 | |
| CN | 102850549 A | 1/2013 | |
| CN | 104449543 A | 3/2015 | |
| CN | 107429114 A | 12/2017 | |
| EP | 2538276 | 12/2012 | |
| JP | 06-267892 | 9/1994 | |
| JP | H093432 A * | 1/1997 | |
| JP | 09-054440 | 2/1997 | |
| JP | 2017-151389 | 8/2017 | |
| KR | 10-2007-0103085 | 10/2007 | |
| KR | 2008110537 A * | 12/2008 | .......... G03F 7/0007 |
| KR | 10-2013-0009695 | 1/2013 | |
| KR | 20140045962 A * | 4/2014 | .......... G03F 7/094 |
| KR | 10-2017-0113390 | 10/2017 | |
| KR | 10-2018-0013729 | 2/2018 | |
| WO | 2012050065 | 4/2012 | |
| WO | WO-2016009939 A1 * | 1/2016 | ............ C08G 77/24 |
| WO | WO-2017119680 A1 * | 7/2017 | ......... A47G 19/2205 |
| WO | WO-2017142153 A1 * | 8/2017 | ............ C08G 77/045 |
| WO | WO-2018079599 A1 * | 5/2018 | ............ C08G 59/68 |
| WO | WO-2019082934 A1 * | 5/2019 | ........... C08G 77/388 |

* cited by examiner

SUBSTRATE TREATING COMPOSITION AND METHOD FOR FABRICATING A SEMICONDUCTOR DEVICE USING THE SAME

CROSS-REFERENCE TO RELATED APPLICATION

This U.S. non-provisional patent application is a divisional application of U.S. patent application Ser. No. 16/243,548, filed on Jan. 9, 2019, which claims priority under 35 U.S.C. § 119 to Korean Patent Application No. 10-2018-0043246, filed on Apr. 13, 2018, the disclosures of which are incorporated by reference herein in their entirety.

TECHNICAL FIELD

Exemplary embodiments of the present inventive concept relate to a substrate treating composition, and more particularly, to a method for fabricating a semiconductor device using the same.

DISCUSSION OF RELATED ART

Recently, according to the increase of speed and the decrease of power consumption in electronic devices, semiconductor devices embedded therein may have relatively rapid operation speed and/or relativity low operation voltage. Thus, semiconductor devices may be relatively highly integrated. Accordingly, increasingly minute processing techniques have been developed. For example, a photolithography for fabricating semiconductor devices may be employed to increase the integration degree of semiconductor devices.

Photolithography is an exemplary method used for forming relatively minute electronic circuit patterns on a substrate during fabricating a semiconductor device. For example, photolithography is a process of transcribing the circuit patterns of a mask to a substrate by transcribing light via the mask on which circuits are printed to a substrate on which a photosensitive material is applied. Light sources used in a photolithography process include G-LINE, I-LINE, KrF, or ArF. According to the miniaturization of the patterns of electronic circuits, relatively minute and elaborate photoresist patterns may be formed by using extreme UV (EUV).

SUMMARY

An exemplary embodiment of the present inventive concept provides a substrate treating composition for forming a monolayer which may restrain the collapse of a resist pattern.

An exemplary embodiment of the present inventive concept provides a method for fabricating a semiconductor device which may more accurately and reliably form minute patterns.

An exemplary embodiment of the present inventive concept provides a substrate treating composition includes a first monomer, a second monomer and an acid. The first monomer is represented by Formula 1.

$$X\text{—}Si(R1)_2(R2) \qquad \text{[Formula 1]}$$

Each of R1 and R2 is an alkyl group of 1 to 20 carbon atoms or an alkoxy group of 1 to 20 carbon atoms, and X is i) a cyclic amine or an organic group including the same, or ii) an alkyl group of 1 to 20 carbon atoms, in which at least one hydrogen atom is substituted with an amino group, a phenyl group in which at least one hydrogen atom is substituted with an amino group or a hydroxyl group, an ester bond, or a combination thereof.

The second monomer is represented by Formula 7.

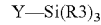
$$\text{[Formula 7]}$$

R3 is an alkoxy group of 1 to 20 carbon atoms, and Y is i) a cyclic amine or an organic group including the same, or ii) an alkyl group of 1 to 20 carbon atoms, in which at least one hydrogen atom is substituted with an amino group, a sulfide bond, an ether bond, an alkyl group of 1 to 20 carbon atoms, which is bonded to a sulfonyl group, or a combination thereof.

A molecular weight of a solid content of the substrate treating composition including the first monomer, the second monomer and the acid may be from about 1,000 g/mol to about 50,000 g/mol.

In an exemplary embodiment of the present inventive concept, a method of fabricating a semiconductor device includes applying a composition including a first monomer and a second monomer on a substrate. The method includes performing a baking process to form a monolayer on the substrate. The method includes forming a photoresist pattern on the monolayer. The first monomer is represented by Formula 1, and the second monomer is represented by Formula 7. The monolayer includes a dehydration-condensation product of the first monomer and the second monomer.

In an exemplary embodiment of the present inventive concept, a method of fabricating a semiconductor device includes applying a composition including a first monomer and a second monomer on a substrate. The method includes performing a baking process to form a monolayer on the substrate, in which the monolayer is bonded to the substrate by a Si—O bond. The first monomer is represented by Formula 1, and the second monomer is represented by Formula 7.

The monolayer may be formed directly on a surface of the substrate without an intervening layer between the monolayer and the substrate.

BRIEF DESCRIPTION OF THE FIGURES

The above and other features of the inventive concept will become more apparent by describing in detail exemplary embodiments thereof, with reference to the accompanying drawings, in which.

DETAILED DESCRIPTION

Figure 1:
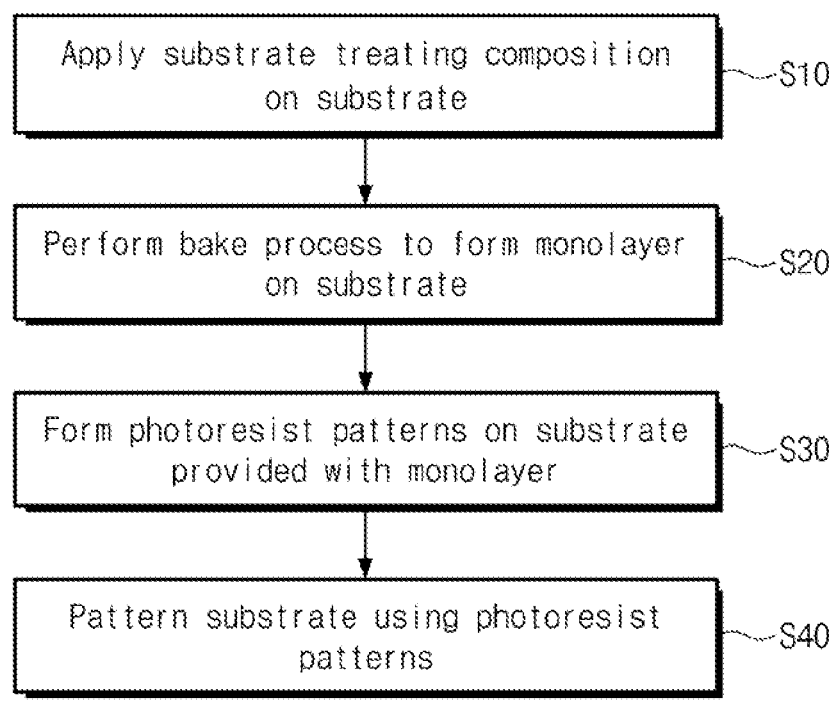
FIG. 1 is a flowchart of a method for fabricating a semiconductor device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein.

According to an exemplary embodiment of the present inventive concept, a substrate treating composition may

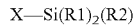

include a first monomer, a second monomer, an acid and a solvent. The acid may be a carboxylic acid, for example, maleic acid. The solvent may include at least one of propylene glycol ethyl ether (PGEE), propylene glycol methyl ether acetate (PGMEA), propylene glycol methyl ether (PGME), or de-ionized water.

The first monomer may be an organic silane of Formula 1.

$$X—Si(R1)_2(R2) \quad \text{[Formula 1]}$$

In Formula 1, each of R1 and R2 may be an alkyl group of 1 to 20 carbon atoms or an alkoxy group of 1 to 20 carbon atoms, and X may be i) a cyclic amine or an organic group including the same, or ii) an alkyl group of 1 to 20 carbon atoms, in which at least one hydrogen atom is substituted with an amino group, a phenyl group in which at least one hydrogen atom is substituted with an amino group or a hydroxyl group, an ester bond, or a combination thereof.

Each of R1 and R2 in Formula 1 may be bonded to a Si atom via a Si—C or Si—O bond. X in Formula 1 may be bonded to a Si atom via a Si—C bond.

X in Formula 1 may have a structure of Formula 2, Formula 3, Formula 4, Formula 5, or Formula 6:

[Formula 2]
—(CH₂)₃—O—C(=O)—C(CH₃)=CH₂

[Formula 3]
—C₆H₄—NH₂

[Formula 4]
—C₆H₄—OH

[Formula 5]
—(CH₂)₃—NH₂

[Formula 6]
(triazine-2,4,6-trione with two allyl groups and one propyl group on the three N atoms)

The first monomer may be, for example, an organic silane of Formula 1-1, Formula 1-2, Formula 1-3, Formula 1-4, Formula 1-5, or Formula 1-6:

[Formula 1-1]
$(CH_3O)_3Si—(CH_2)_3—O—C(=O)—C(CH_3)=CH_2$

[Formula 1-2]
$(CH_3O)_3Si—C_6H_4—NH_2$

[Formula 1-3]
$(CH_3O)_3Si—C_6H_4—OH$

[Formula 1-4]
$RO—Si(OR)(R)—(CH_2)_3—NH_2$ in which R may be an alkyl group of 1 to 20 carbon atoms,

[Formula 1-5]
$RO—Si(R)(R)—(CH_2)_3—NH_2$ in which R may be an alkyl group of 1 to 20 carbon atoms,

[Formula 1-1]
(triazine-2,4,6-trione with two allyl groups on two N atoms and —CH₂CH₂—Si(OC₂H₅)₃ on the third N)

The second monomer may be an organic silane of Formula 7.

$$Y—Si(R3)_3 \quad \text{[Formula 7]}$$

In Formula 7, R3 may be an alkoxy group of 1 to 20 carbon atoms, and Y may be i) a cyclic amine or an organic group including the same, or ii) an alkyl group of 1 to 20 carbon atoms, in which at least one hydrogen atom is substituted with an amino group, a sulfide bond, an ether bond, an alkyl group of 1 to 20 carbon atoms, which is bonded to a sulfonyl group, or a combination thereof.

R3 of Formula 7 may be bonded to a Si atom via a Si—O bond, and Y of Formula 7 may be bonded to a Si atom via a Si—C bond.

Y of Formula 7 may have a structure of Formula 8, Formula 9, Formula 10, Formula 11, Formula 12, or Formula 13.

[Formula 8]
(branched alkyl—OTs)

in which Ts is a p-toluenesulfonyl group.

[Formula 9]
(alkyl chain—OMs)

in which Ms is a methanesulfonyl group.

[Formula 10]
(alkyl—O—alkyl—OMs)

in which Ms is a methanesulfonyl group.

[Formula 11]

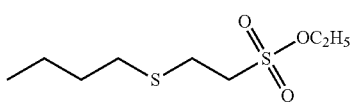

[Formula 12]

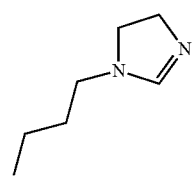

—(CH$_2$)$_3$—NH$_2$ [Formula 13]

The second monomer may be, for example, an organic silane of Formula 7-1, Formula 7-2, Formula 7-3, Formula 7-4, Formula 7-5, or Formula 7-6.

[Formula 7-1]

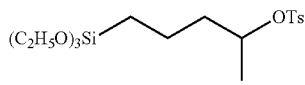

in which Ts is a p-toluenesulfonyl group.

[Formula 7-2]

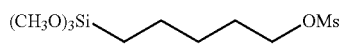

in which Ms is a methanesulfonyl group.

[Formula 7-3]

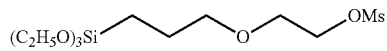

in which Ms is a methanesulfonyl group.

[Formula 7-4]

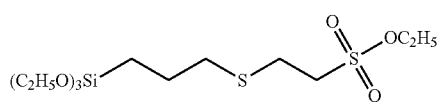

[Formula 7-5]

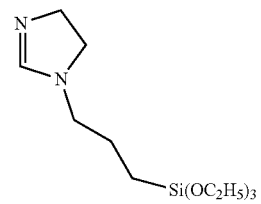

(CH$_3$O)$_3$Si—(CH$_2$)$_3$—NH$_2$ [Formula 7-6]

a molecular weight of a solid content of the substrate treating composition may be from about 1,000 g/mol to about 100,000 g/mol. The solid content may be the total components of the substrate treating composition excluding the solvent. The solid content may include the first monomer, the second monomer and the acid. The molecular weight of the solid content may be, for example, from about 1,000 g/mol to about 50,000 g/mol. If the molecular weight of the solid content is more than 100,000 g/mol, the substrate treating composition may form a gel and the performance of a coating process which will be described in more detail below, may deteriorate. For example, a viscosity of the substrate treating composition may be higher than desired if the molecular weight of the solid content is more than 100,000 g/mol. If the molecular weight of the solid content is less than about 1,000 g/mol, an ability to form a monolayer which will be described in more detail below, may be reduced. For example, a viscosity of the substrate treating composition may be lower than desired in the molecular weight of the solid content is less than about 1,000 g/mol.

The substrate treating composition may be used in a lithography process for fabricating a semiconductor device. The substrate treating composition may be used for surface treatment of the substrate prior to forming a photoresist pattern on the substrate.

FIG. 1 is a flowchart of a method for fabricating a semiconductor device according to an exemplary embodiment of the present inventive concept. FIGS. 2, 4, 5 and 6 are cross-sectional views of a method for fabricating a semiconductor device according to an exemplary embodiment of the present inventive concept. FIG. 3 is an enlarged view of area A in FIG. 2.

Figure 2:
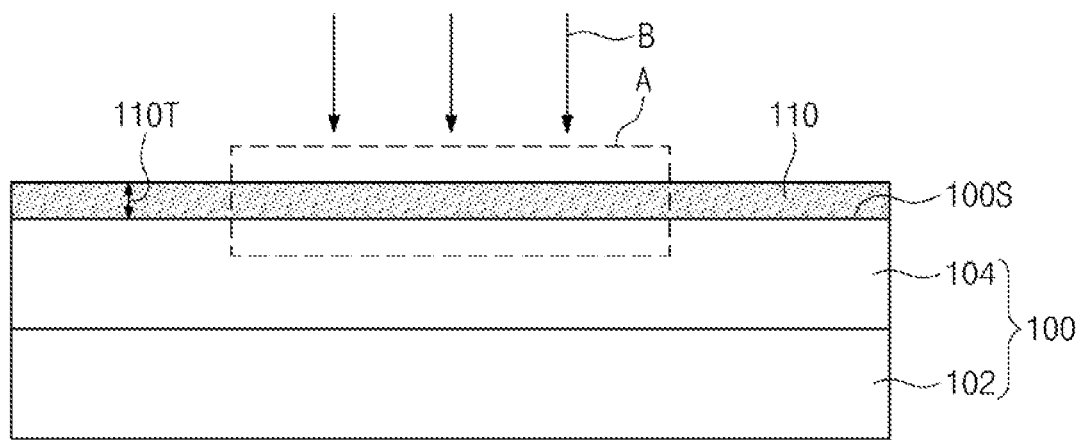
FIGS. 2, 4, 5 and 6 are cross-sectional views of a method for fabricating a semiconductor device according to an exemplary embodiment of the present inventive concept.
Figure 3:
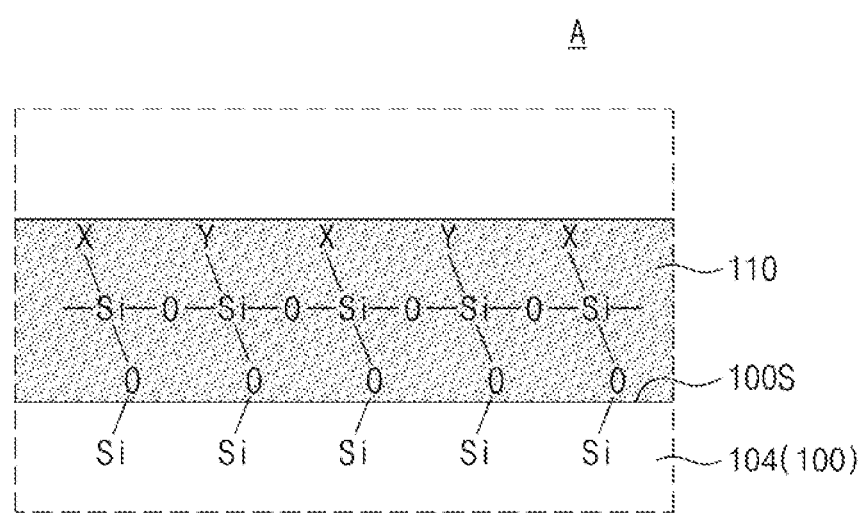
FIG. 3 is an enlarged view of area A in FIG. 2.

Referring to FIGS. 1 and 2, a substrate treating composition may be applied on a substrate 100 (S10). The substrate 100 may include a support substrate 102 and a lower layer 104 on the support substrate 102. The support substrate 102 may be a semiconductor substrate (for example, a silicon substrate, a germanium substrate, or a silicon-germanium substrate). The lower layer 104 may include a conductive layer and/or an insulating layer. The substrate treating composition may be applied on a surface 100S of the substrate 100, for example, by a spin coating method. The surface 100S of the substrate 100 may correspond to a surface of the lower layer 104 facing away from the support substrate 102. The substrate treating composition may be applied directly onto the surface 100S of the substrate 100. The upper portion of the lower layer 104, which is adjacent to the surface 100S of the substrate 100, may include a silicon oxide layer, a silicon nitride layer and/or a silicon oxynitride layer. According to an exemplary embodiment of the present inventive concept, the lower layer 104 may be omitted. In this case, the substrate treating composition may be applied onto a surface of the support substrate 102. For example, the substrate treating composition may be applied directly onto a surface of the support substrate 102.

Referring to FIGS. 1, 2 and 3, a bake process (B) may be performed to form a monolayer 110 on the substrate 100 (S20). By the bake process B, a dehydration-condensation reaction of the first monomer and the second monomer in the substrate treating composition may be carried out. Due to this, the monolayer 110 may be formed on the surface 100S of the substrate 100. The monolayer 110 may include the dehydration-condensation product of the first monomer and the second monomer. In an exemplary embodiment of the present inventive concept, a silicon atom of the first monomer (e.g., Si of Formula 1) may be bonded to a silicon atom of the substrate 100 via a Si—O bond by the reaction of R1 or R2 of Formula 1 with the silanol (Si—OH) of the substrate 100. A silicon atom of the second monomer (e.g., Si of Formula 7) may be bonded to a silicon atom of the substrate 100 via a Si—O bond by the reaction of R3 of Formula 7 with the silanol (Si—OH) of the substrate 100. A silicon atom of the first monomer (e.g., Si of Formula 1) and a silicon atom of the second monomer (e.g., Si of Formula 7) may be bonded to each other via a Si—O bond by the reaction of R1 or R2 of Formula 1 with R3 of Formula 7. A hydrophobic group of the first monomer (e.g., X of Formula 1) and a hydrophobic group of the second monomer (e.g., Y of Formula 7) need not participate in the dehydration-condensation reaction, but may be arranged in the monolayer 110. By the hydrophobic group of the first monomer (e.g., X of Formula 1) and a hydrophobic group of the second monomer (e.g., Y of Formula 7), the monolayer 110 may have hydrophobicity.

The bake process (B) may be performed, for example, at a temperature of from about 110° C. to about 240° C. The monolayer 110 may make direct contact with the surface 100S of the substrate 100. For example, the silicon atom in the monolayer 110 may be bonded to the silicon atom of the substrate 100 via a Si—O bond. A thickness 110T of the monolayer 110 may be about 3 nm or less.

In an exemplary embodiment of the present inventive concept, a method of fabricating a semiconductor device may include applying a composition including a first monomer and a second monomer on a substrate. The method may include performing a baking process to form the monolayer 110 on the substrate 100, in which the monolayer 110 is bonded to the substrate 100 by a Si—O bond (see, e.g., FIG. 3). The first monomer may be represented by Formula 1, and the second monomer may be represented by Formula 7, as described herein. The monolayer 110 may be formed directly on a surface (e.g., surface 100S) of the substrate 100 without an intervening layer between the monolayer 110 and the substrate 100.

Figure 4:
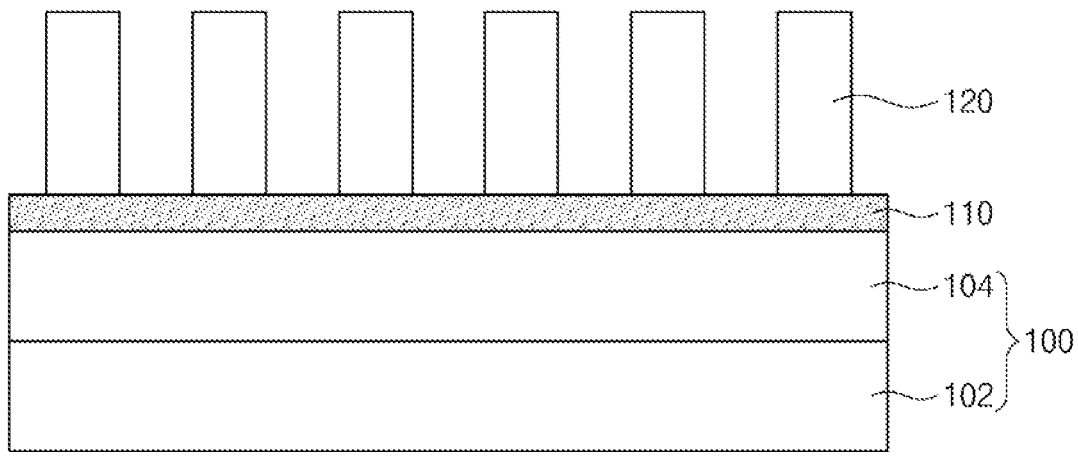

Referring to FIGS. 1 and 4, photoresist patterns 120 may be formed on the substrate 100 on which the monolayer 110 is provided (S30). The forming of the photoresist patterns 120 may include applying a photoresist layer on the substrate 100 on which the monolayer 110 is formed, and performing an exposing process and a developing process on the photoresist layer. A light source used in the exposing process may be, for example, extreme ultraviolet (EUV), and the developing process may be a positive-tone development (PTD) process or a negative-tone development (NTD) process.

To increase the adhesion of the photoresist patterns 120 to the substrate 100, an adhesion promoter may be provided between the substrate 100 and the photoresist patterns 120. Since, in the EUV lithography process, a function for controlling light reflectivity might not be used for the adhesion promoter, a subsequent etching process may be performed more efficiently if the thickness of the adhesion promoter is relatively small. Generally, in the EUV lithography process, an underlayer which is used as the adhesion promoter may be formed to a thickness of about 5 nm or more due to the limitation according to the thickness distribution of a material coated on the substrate 100. If an etching process using the photoresist patterns 120 as an etching mask is performed, the underlayer may become an etch burden during the etching process due to the relatively large thickness. Further, if at least a portion of the underlayer is not etched during the etching process and remains between the photoresist patterns 120, a bridge defect may be induced between patterns formed by pattering the substrate 100 by the etching process.

According to an exemplary embodiment of the present inventive concept, the monolayer 110 having hydrophobicity may be formed on the substrate 100 by using the substrate treating composition including the first monomer and the second monomer. The monolayer 110 may be formed to a thickness of about 3 nm or less. Since the monolayer 110 is hydrophobic, the monolayer 110 may function as the adhesion promoter between the substrate 100 and the photoresist patterns 120. In addition, since the monolayer 110 is formed to a relatively small thickness, the etching of the monolayer 110 during the etching process using the photoresist patterns 120 as an etching mask may be accurately performed. Accordingly, an occurrence of bridge defect between patterns formed by pattering the substrate 100 by the etching process may be reduced or eliminated.

Figure 5:
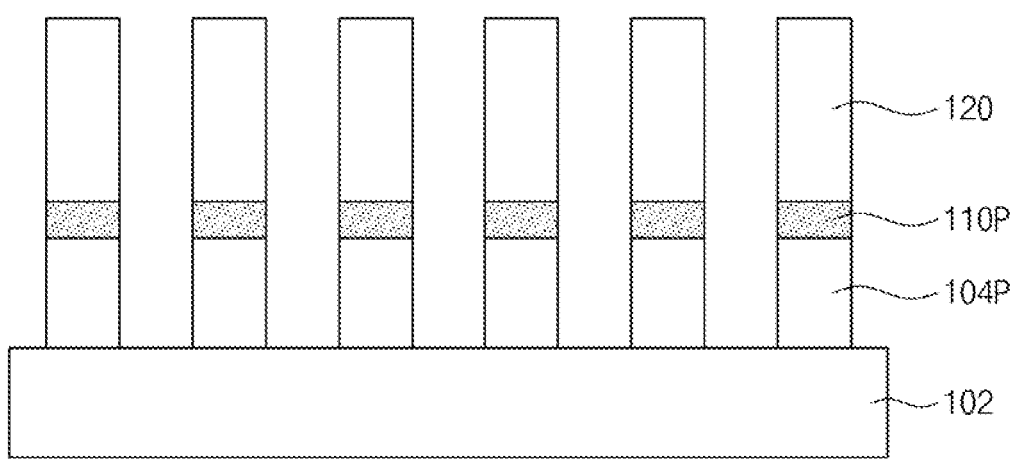

Referring to FIGS. 1 and 5, the substrate 100 may be patterned using the photoresist patterns 120 (S40). The patterning of the substrate 100 may include etching the monolayer 110 and the upper portion of the substrate 100 (e.g., the lower layer 104) using the photoresist patterns 120 as an etching mask. Accordingly, lower patterns 104P may be formed on the support substrate 102, and the remainder 110P of the monolayer 110 may be disposed between each of the photoresist patterns 120 and each of the lower patterns 104P. According to an exemplary embodiment of the present inventive concept, the lower layer 104 may be omitted, and in this case, the patterning of the substrate 100 may include etching of the monolayer 110 and the upper portion of the substrate 100 (e.g., the upper portion of the support substrate 102) using the photoresist patterns 120 as an etching mask. In this case, the remainder 110P of the monolayer 110 may be disposed between each of the photoresist patterns 120 and each of the patterns in the support substrate 102. According to an exemplary embodiment of the present inventive concept, since the monolayer 110 is formed to a relatively small thickness, the etching of the monolayer 110 may be accurately performed in the etching process using the photoresist patterns 120 as an etching mask. Accordingly, an occurrence of a bridge defect between patterns formed (e.g., the lower patterns 104P or the patterns in the support substrate 102) may be reduced or eliminated by patterning the substrate 100 by the etching process.

Figure 6:
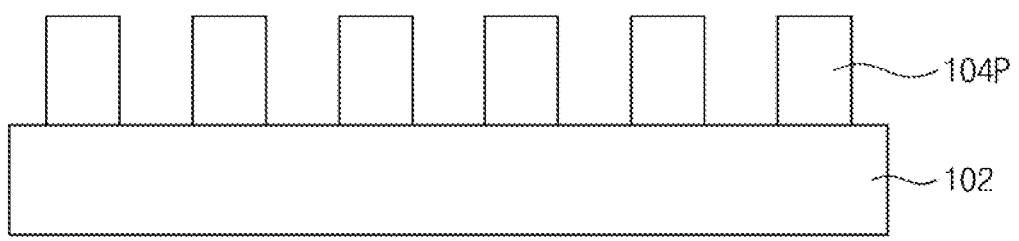

Referring to FIG. 6, after forming the patterns (e.g., the lower patterns 104P or the patterns in the support substrate 102), the photoresist patterns 120 may be removed. The removing process of the photoresist patterns 120 may include ashing and/or stripping processes. The remainder 110P of the monolayer 110 may be removed by the removing process of the photoresist patterns 120.

Preparation Example of Substrate Treating Composition

A first monomer may be added to a solvent in a ratio shown below to prepare a solution.

TABLE 1

| Solution | First monomer | Solvent | | | |
|---|---|---|---|---|---|
| | | PGEE | PGMEA | PGME | DIW |
| Amount ratio (wt %) | 0.1 | 75 | 12 | 5 | 8 |

To the solution above, an acid and a second monomer may be added in ratios shown below to prepare a substrate treating composition. The acid may be maleic acid.

TABLE 2

| Composition | Solution First monomer + Solvent | Acid Maleic acid | Second monomer |
|---|---|---|---|
| Amount ratio (wt %) | 100 | 0.01 | 0.0005 |

The molecular weight of the solid content in the substrate treating composition may be about 2,000 g/mol. The solid content may refer to the total components in the composition excluding the solvent.

Exemplary Surface Properties of Monolayer

Example 1

A silicon substrate may be prepared. 1 ml of the substrate treating composition prepared by the Preparation Example above may be applied on a substrate, and a spin coating process may be performed in conditions of about 1,500 rpm/60 seconds. Then, a bake process may be performed at a temperature of about 110° C. to form a monolayer on the substrate. The contact angle of water with respect to a surface of the substrate on which the monolayer was formed may be measured.

Example 2

A silicon substrate on which a silicon nitride layer is formed may be prepared. 1 ml of the substrate treating composition prepared by the Preparation Example above may be applied on the silicon nitride layer, and a spin coating process may be performed in conditions of about 1,500 rpm/60 seconds. As in Example 1, a bake process may be performed to form a monolayer on the silicon nitride layer. The contact angle of water was with respect to a surface of the silicon nitride layer on which the monolayer was formed may be measured.

Comparative Example 1

A silicon substrate may be prepared. A separate coating film might not be formed on the substrate, and the contact angle of water with respect to a surface of the substrate may be measured.

Comparative Example 2

A substrate on which a silicon nitride layer is formed may be prepared. As in Comparative Example 1, a separate coating film might not be formed, and the contact angle of water with respect to a surface of the silicon nitride layer may be measured.

Comparative Example 3

A silicon substrate may be prepared. A conventional underlayer may be formed on the substrate, and the contact angle of water with respect to a surface of the substrate on which the underlayer was formed may be measured.

Exemplary Measurement of a Contact Angle of Water

TABLE 3

|  | Substrate | Coating film | Contact angle of water |
| --- | --- | --- | --- |
| Experimental Example 1 | Bare-Si | Monolayer | 62 degrees |
| Experimental Example 2 | SiON | Monolayer | 50 degrees |
| Comparative Example 1 | Bare-Si | None | <20 degrees |
| Comparative Example 2 | SiON | None | <20 degrees |
| Comparative Example 3 | Bare-Si | Underlayer | 58 degrees |

From the exemplary measurements of the contact angle, the monolayer formed on the substrate using the substrate treating composition may be found to have hydrophobicity. Further, the degree of hydrophobicity of the monolayer may be increased when compared with the conventional underlayer.

Evaluation of EUV Patterning

Example 1

A silicon substrate on which a silicon nitride layer is formed may be prepared. The substrate treating composition prepared by the Preparation Example above may be applied on the silicon nitride layer, and a bake process may be performed at about 110° C. to form a monolayer. On the substrate on which the monolayer was formed, a photoresist layer may be coated. The photoresist layer may be exposed using an EUV stepper and developed to form a photoresist pattern. The size of the photoresist pattern may be about 16 nm. The collapse state of the photoresist pattern may be examined using a scanning electron microscope (SEM).

Example 2

The same procedure as Example 1 may be performed except for performing the bake process at about 240° C. during forming the monolayer.

Comparative Example 1

A substrate on which a silicon nitride layer is formed may be prepared. The silicon nitride layer may be treated with hexamethyldisilazene (HMDS), and a photoresist pattern may be formed on the substrate by the same procedure described in Example 1. The collapse state of the photoresist pattern may be examined using a scanning electron microscope (SEM).

Exemplary Collapse States

TABLE 4

|  | Pattern size | Substrate treating composition | Bake temperature | Test result |
| --- | --- | --- | --- | --- |
| Example 1 | 16 nm | Used | 110° C. | Pattern good |
| Example 2 | 16 nm | Used | 240° C. | Pattern good |
| Comparative Example 1 | 16 nm | Unused | — | Pattern collapse |

From the evaluation results of the photoresist pattern, it may be found that the pattern collapse of the photoresist pattern formed on the monolayer was not generated. For example, the monolayer may be found to have adhesion properties for the photoresist pattern.

According to an exemplary embodiment of the present inventive concept, the substrate treating composition may include the first monomer, the second monomer, the acid and the solvent. Each of the first monomer and the second monomer may have a hydrophobic group. The molecular weight of the solid content excluding the solvent may be from about 1,000 g/mol to about 100,000 g/mol. The monolayer 110 may be formed by applying the substrate treating composition on the substrate 100 and performing the bake process (B).

Since the monolayer 110 is formed to have hydrophobicity, the monolayer 110 may function as the adhesion promoter between the substrate 100 and the photoresist patterns 120. Due to this, the collapse of the photoresist patterns 120 may be prevented.

In addition, since the monolayer 110 is formed to a relatively small thickness, the etching of the monolayer 110 in an etching process using the photoresist patterns 120 as an etching mask may be accurately performed. Thus, an occurrence of a bridge defect between patterns which were formed by patterning the substrate 100 by the etching process may be reduced or eliminated, and as a result, minute patterns having relatively small pitches may be accurately and reliably formed.

Accordingly, a substrate treating composition for forming a monolayer which may restrain the collapse of a resist pattern may be provided, and a method for fabricating a semiconductor device, by which minute patterns are accurately formed, may be provided.

According to an exemplary embodiment of the present inventive concept, a substrate treating composition for forming a monolayer which may restrain the collapse of a resist pattern may be provided, and a method for fabricating a semiconductor device, by which minute patterns may be accurately formed, may be provided.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A substrate treating composition, consisting essentially of a solid content and a solvent, the solid content consisting a first monomer, a second monomer, a dehydration-condensation product of the first monomer and the second monomer, and an acid, wherein
the first monomer is represented by Formula 1:

X—Si(R1)$_2$(R2)  [Formula 1]

wherein each of R1 and R2 is an alkyl group of 1 to 20 carbon atoms or an alkoxy group of 1 to 20 carbon atoms, and X is represented by Formula 2 or Formula 4:

  [Formula 2]

  [Formula 4]

the second monomer is represented by Formula 7:

Y—Si(R3)$_3$  [Formula 7]

wherein R3 is an alkoxy group of 1 to 20 carbon atoms, and Y is represented by Formula 8, Formula 9, Formula 10, Formula 11, Formula 12:

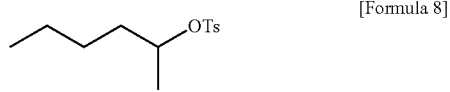 [SMILES: CCCCC(C)OS(=O)(=O)c1ccc(C)cc1]  [Formula 8]

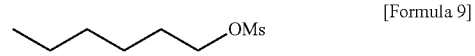  [Formula 9]

in which Ts is a p-toluenesulfonyl group, in which Ms is a methanesulfonyl group,

  [Formula 10]

in which Ms is a methanesulfonyl group,

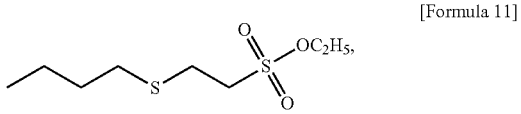  [Formula 11]

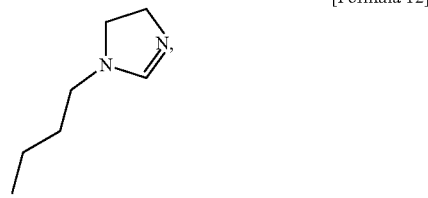  [Formula 12]

wherein a molecular weight of the dehydration-condensation product of the first monomer and the second monomer is from 1,000 g/mol to 100,000 g/mol.

2. The substrate treating composition of claim 1, wherein X is bonded to a Si atom via a Si—C bond, and Y is bonded to a Si atom via a Si—C bond.

3. The substrate treating composition of claim 1, wherein the solvent comprises at least one of propylene glycol ethyl ether (PGEE), propylene glycol methyl ether acetate (PGMEA), propylene glycol methyl ether (PGME), or de-ionized water.

4. The substrate treating composition of claim 3, wherein the acid is a carboxylic acid.

5. The substrate treating composition of claim 1, wherein the first monomer is an organic silane represented by Formula 1-1 or Formula 1-3:

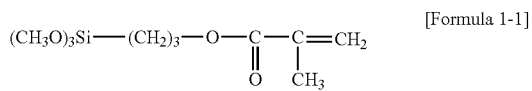  [Formula 1-1]

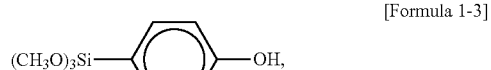  [Formula 1-3]

6. The substrate treating composition of claim 1, wherein the second monomer is an organic silane represented by Formula 7-1, Formula 7-2, Formula 7-3, Formula 7-4, or Formula 7-5:

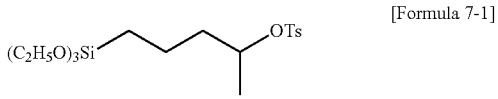  [Formula 7-1]

in which Ts is a p-toluenesulfonyl group,

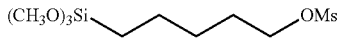

[Formula 7-2]

in which Ms is a methanesulfonyl group,

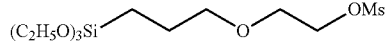

[Formula 7-3]

in which Ms is a methanesulfonyl group,

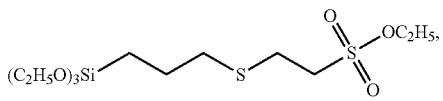

[Formula 7-4]

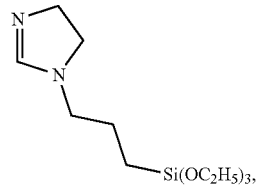

[Formula 7-5]

7. The substrate treating composition of claim 1, wherein a ratio of a content by wt % of the first monomer to a content by wt % of the solvent is 0.1:100.

8. The substrate treating composition of claim 1, wherein a ratio of a content by wt % of the second monomer to a content by wt % of a solution including the first monomer and the solvent is 0.0005:100.

* * * * *